United States Patent [19]
Stubbe et al.

[11] Patent Number: 5,686,847
[45] Date of Patent: Nov. 11, 1997

[54] REDUCED SENSITIVITY POWER-ON RESET CIRCUITRY

[75] Inventors: Frederic M. Stubbe, Irvine; Daryush Shamlou, Laguna Niguel; Armond Hairapetian, Glendale, all of Calif.

[73] Assignee: Rockwell International Corporation, Newport Beach, Calif.

[21] Appl. No.: 616,421

[22] Filed: Mar. 15, 1996

[51] Int. Cl.$^6$ .................................................. H03L 7/00
[52] U.S. Cl. ........................................ 327/143; 327/198
[58] Field of Search ............................. 327/72, 77, 80, 327/143, 161, 198, 538, 539, 540, 544, 545

[56] References Cited

U.S. PATENT DOCUMENTS

| | | | |
|---|---|---|---|
| 4,886,984 | 12/1989 | Nakaoka | 327/143 |
| 5,159,206 | 10/1992 | Tsay et al. | 327/143 |
| 5,287,011 | 2/1994 | Koshikawa et al. | 327/143 |
| 5,394,104 | 2/1995 | Lee | 327/143 |
| 5,467,037 | 11/1995 | Kumar et al. | 327/143 |
| 5,477,176 | 12/1995 | Chang et al. | 327/143 |
| 5,495,196 | 2/1996 | Rothman | 327/143 |
| 5,497,112 | 3/1996 | Hoang | 327/143 |

*Primary Examiner*—Timothy P. Callahan
*Assistant Examiner*—My-Trang Nu Ton
*Attorney, Agent, or Firm*—William C. Cray; Philip K. Yu

[57] ABSTRACT

A circuit for resetting an electronic system based on voltage fluctuations in the power supply is disclosed. The circuit comprises a diode means for generating a first voltage being offset from the supply voltage, a first inverter having its input connected to the diode and powered by a reference voltage source, a second inverter having its input connected to the same reference voltage source and powered by the power supply; and an OR- or NOR- gate having its inputs from the outputs of the first and second inverters, such that its output, when asserted, resets the electronic system.

9 Claims, 2 Drawing Sheets

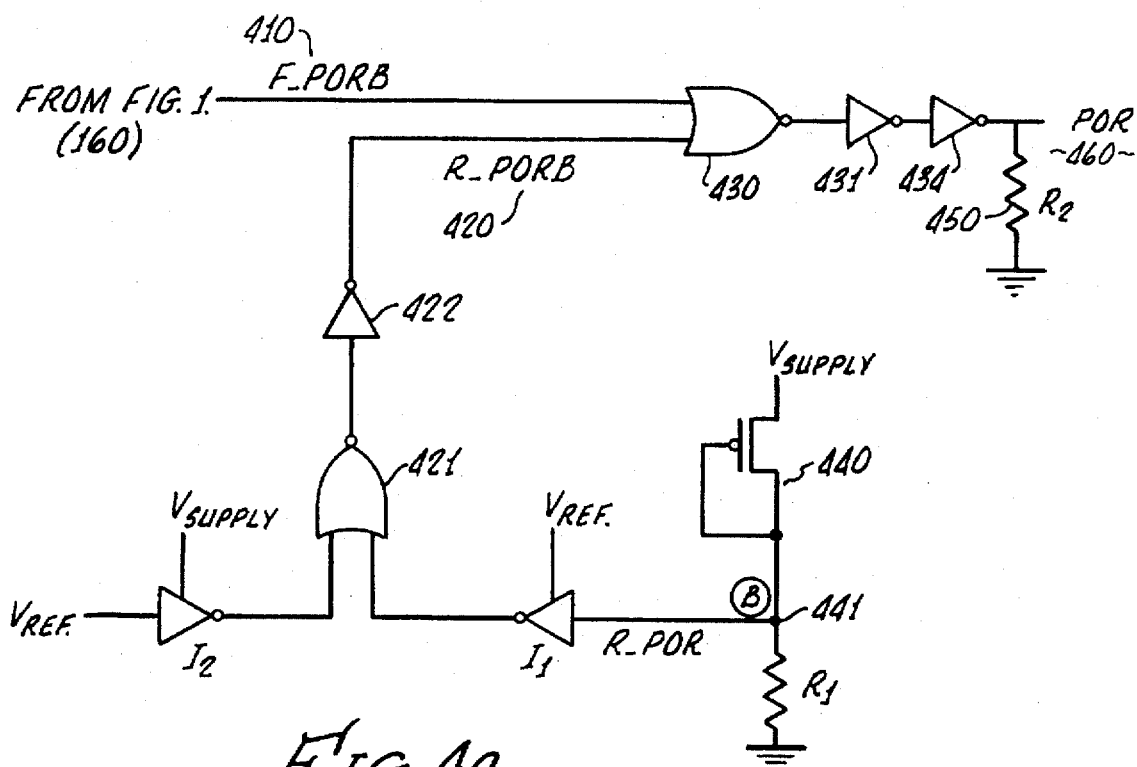
_Fig. 4a._
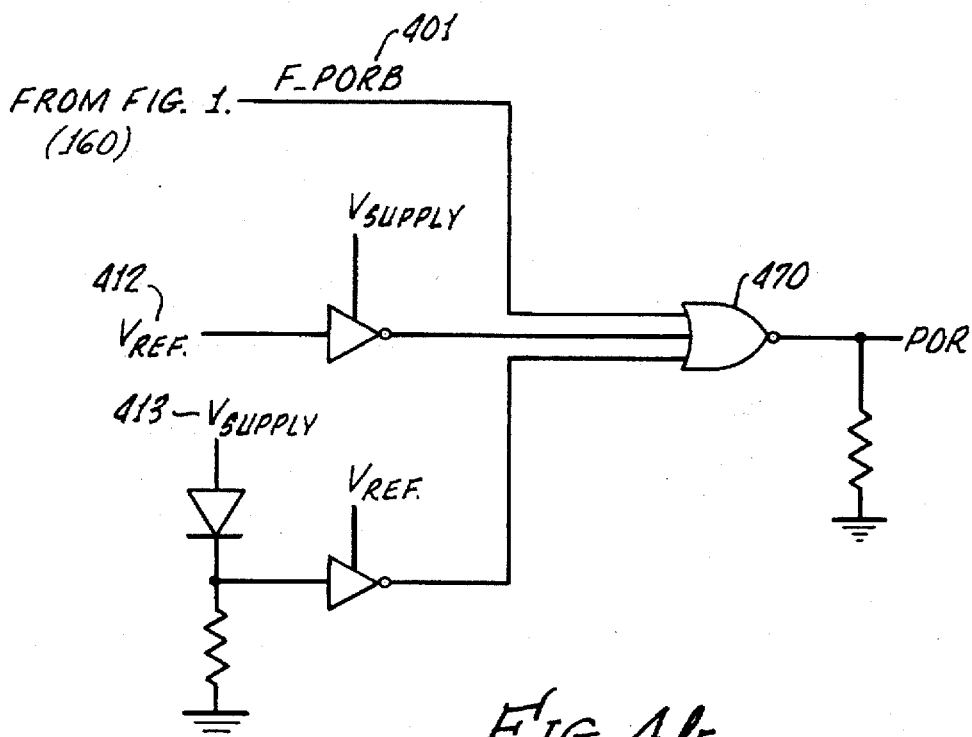
_Fig. 4b._

REDUCED SENSITIVITY POWER-ON RESET CIRCUITRY

FIELD OF THE INVENTION

The present invention relates to power-on reset ("POR") circuitry in an electronic system and more particularly to power-on reset circuitry with reduced sensitivity to supply voltage fluctuations in the electronic system.

BACKGROUND OF THE INVENTION

It has been quite common to use power-on reset ("POR") circuitry on an integrated device to monitor whether the power supply of the electronic device is actually at a normal operational level for the device. If the power supply is below the operational level, a power-down signal will be generated to facilitate shutting down the rest of the device. The reasoning is simple: when the supply voltage is below its operational level, the device will not function properly and any data thus generated tend to be inaccurate and unreliable. When the supply voltage is above the operational level, a power-on signal is generated to indicate that the device is now operating properly.

One scenario for this POR circuitry is that when a device is first powered up, the device should not be operating before its supply voltage has ramped up to its normal operating level. Especially for battery-powered devices, such as pagers or wireless personal communication systems, the battery tends to age over time. At certain point, the battery will not be able to deliver the operational supply voltage. Then the real useful thing to do is to shut the unit down such that the user becomes aware of the battery problem. Without such measures, the user will be misled into thinking that the device is still working and generating valid data, when in fact it is not.

One inherent problem with the conventional POR circuitry is that it is powered and referenced by the same supply voltage it is supposed to monitor. When the supply voltage is below its operational level, any decision about the fitness of the power supply is likely to be erroneous and unreliable. What has been implemented in the past is that a bandgap voltage source is used as the reference source for the POR circuitry. The bandgap voltage source, which is well understood by those skilled in the art, generates a fixed voltage which is quite temperature- and process-independent. Most important of all, the bandgap voltage generated is fairly constant vis-a-vis the supply voltage. With a benchmark like the bandgap voltage, the supply voltage can be properly compared and monitored, thus accomplishing its purpose.

FIG. 1 is an example of a simplified POR circuit using the bandgap voltage source 110 as a benchmark. The reference voltage input to the comparator 125 is the bandgap voltage $V_{BG}$ 112. The monitored voltage input of the comparator 125 is a decreased supply voltage Vx in such a way that Vx equals to the reference voltage $V_{BG}$ 112 in nominal conditions, when the supply voltage 105 is at the lowest operational voltage. When $V_{SUPPLY}$ 105 is below the lowest operational voltage, the comparator 125 will produce a low POR output 160, which deactivates the system. It should be noted, for the sake of consistency throughout the present description, that a deactivated POR signal is defined as a signal which will deactivate the system. Thus, a deactivated POR signal is currently implemented as a "LOW" POR signal.

However, to prevent the POR signal 160 from the effect of small and short voltage spikes below the operational supply voltage, a counter 150 is used to count a prescribed time, e.g. 1 ms, before the POR signal 160 is deactivated. If, after 1 ms, C_out 145 is back to normal such as in the case of a short voltage dip, the POR 160 need not be deactivated. This so-called "time-averaging" method thus shields the electronic device from the short and small voltage dips or spikes in the range of nanoseconds in the power supply. If the spike lasts more than the prescribed counter time, then the POR signal 160 is de-activated since the device is operating below normal conditions longer than the prescribed time. This is called the "fine-POR" circuitry.

At power-up, since the reference voltage 110 typically takes awhile to rise to its nominal level, the POR circuitry may construe that as an operational power supply, thus causing the device to be activated erroneously.

For voltage swings much larger than the small spikes, the POR circuitry should generate a low POR signal 160 at once, irrespective of the duration of the variation, for the device to respond. To "rough-tune" the POR circuitry, a circuit such as the one shown in FIG. 2 has been used. When the voltage supply $V_{SUPPLY}$ 205 causes the voltage $V_1$ 206 to fall below a given threshold, $V_1$ 206 will cause the inverter $I_1$ 210 to activate the signal POR-bar 215, which is then inverted by inverter $I_2$ 220 to generate an inactivated POR signal 230. Note that the threshold level can be set based on the diode voltage VD across the MOS diode 235. As such, when a "catastrophic" voltage drop occurs, the POR signal 230 is deactivated immediately by the "rough POR" circuitry.

However, the "rough POR" circuitry in FIG. 2 also has its share of those inherent problems, since it is powered by the same supply voltage it is supposed to monitor. This dependence results in a wide range of inverter threshold voltages over process, temperature and supply voltage for the POR circuitry. In order to ensure operation with all operational supply voltages, the threshold voltage of inverter $I_1$ needs to be very low, and therefore the effective range for the rough POR to react is decreased.

Therefore, it would be desirable to have a POR circuit which can quickly respond to a significant voltage variation.

It would also be desirable to have a POR circuit which can be fairly independent over process and temperature variations.

SUMMARY OF THE INVENTION

A circuit for resetting an electronic system based on voltage fluctuations in the power supply is disclosed. The circuit comprises a diode means for generating a first voltage being offset from the supply voltage, a first inverter having its input connected to the diode and powered by a reference voltage source, a second inverter having its input connected to the same reference voltage source and powered by the power supply; and an OR- or NOR- gate having its inputs from the outputs of the first and second inverters, such that its output, when asserted, resets the electronic system.

BRIEF DESCRIPTION OF THE DRAWINGS

Additional objects, features and advantages of the present invention will become apparent to those skilled in the art from the following description, wherein:

FIG. 4(a) is one embodiment of the combined "rough POR" and "fine POR" circuit in accordance with the present invention.

FIG. 4(b) is another embodiment of the combined "rough POR" and "fine POR" circuit in accordance with the present invention.

DETAILED DESCRIPTION OF THE DRAWINGS

A reduced sensitivity power-on reset circuit with cross-coupled supply voltage is disclosed. In the following description, numerous specific details are set forth, such as voltage levels, polarities, types of transistors, logic gates, etc., in order to provide a thorough understanding of the present invention. It should be understood, however, by those skilled in the art that these details are not required to practice the present invention. In other instances, well known circuits, methods and the like are not set forth in detail to avoid unnecessarily obscuring the present invention.

Figure 3:
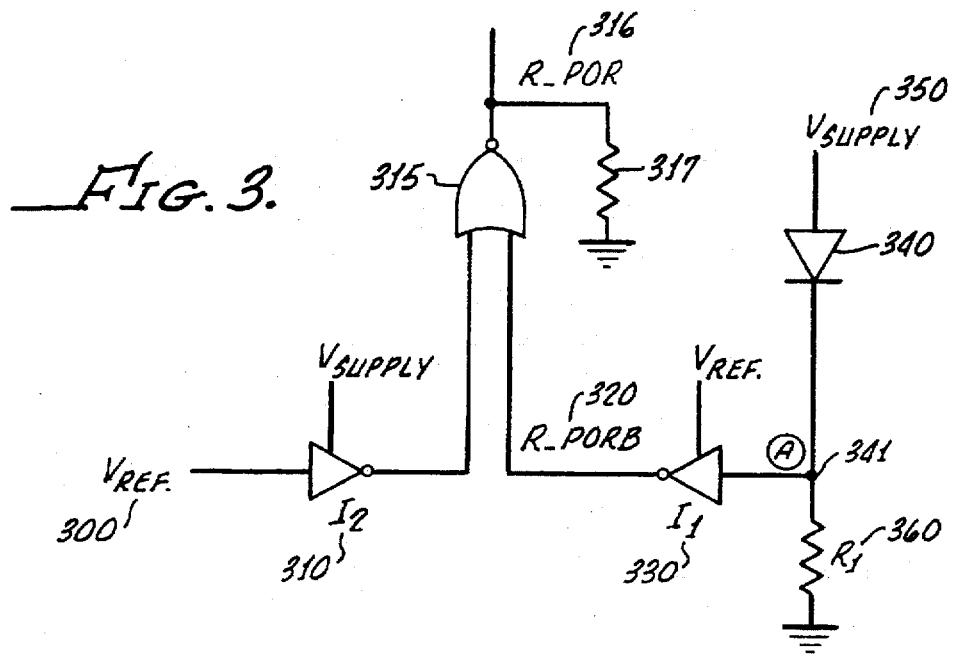
FIG. 3 is a circuit diagram of the "rough POR" circuit with cross-coupled supply voltage in accordance with the present invention.

Referring to FIG. 3, a circuit diagram of the POR circuit with cross-coupled supply voltage in accordance with the present invention is shown. To monitor the supply voltage $V_{SUPPLY}$ 350, the voltage $V_{SUPPLY}$ is applied through a diode 340 (e.g. MOS diode) with a pre-set voltage $V_D$ across the diode. The output of the diode 340 at node A 341 is applied to an inverter 330 to generate an output signal R_PORB 320. The signal R_PORB 320 is applied to a NOR gate 315. Node A 341 is also coupled to ground through a resistor $R_1$ 360.

On the other end, a reference $V_{REF}$ 300, which is derived from a bandgap voltage source, is applied to an inverter 310 with its output also connected to another input to the NOR gate 315. To cross-couple the supply voltage, the inverter $I_1$ 330 is supplied by the reference voltage $V_{REF}$ 300, while the inverter $I_2$ 310 is supplied by the supply voltage $V_{SUPPLY}$ 350. The NOR gate 315 generates an output R_POR 316.

The following describes how the cross-coupled POR circuit operates to monitor the larger, catastrophic voltage swings of the supply voltage $V_{SUPPLY}$ 350. By using the voltage drop $V_D$ across the diode 340 to adjust the voltage at node A 341 for $V_{SUPPLY}$ 350, the voltage at node A 341 can be set at the threshold level of the inverter $I_1$ 330. That is, when $V_{SUPPLY}$ 350 falls below the operational level, the "low" voltage at node A 341 will be inverted by the inverter $I_1$ 330 to a high R_PORB signal 320, which will force the output R_POR 316 of the NOR gate 315 to go low, which is used to cause the rest of the circuit to shut down.

As previously described, the inverter $I_1$ 330 is powered and referenced by the reference voltage $V_{REF}$ 300 derived from the bandgap voltage source, which is much more stable and independent over process and temperature, and therefore narrowing down the $I_1$ threshold voltage range. As a result, the voltage $V_{REF}$ can enable the inverter $I_1$ 330 to monitor the true voltage swings of $V_{SUPPLY}$ 350.

If $V_{REF}$ is not at its operational level, e.g. directly after startup when $V_{REF}$ comes up slowly, the output of the comparator will be erroneously high, indicating that the supply voltage is high enough, while in fact it is not. Therefore, to ensure that $V_{REF}$ 300 itself is at its operational level and that it is accurate as a reference voltage and a supply voltage for $I_1$, $V_{REF}$ 300 is applied to an inverter $I_2$ 310 to generate its output as an input to the NOR gate 315. Note that the inverter $I_2$ 310 is supplied and referenced by the same supply voltage $V_{SUPPLY}$ 350. If the bandgap voltage source is not working up to its normal level, the low $V_{REF}$ 300 is inverted by the inverter $I_2$ 310 to a high. A high input to the NOR gate 315 will force the output R_POR 316 of the NOR gate to go low, essentially ignoring the status of the other input to the NOR gate 315. This generates a low POR signal, shutting down the circuit, irrespective of the level of $V_{SUPPLY}$ 350. Note that although the inverter $I_2$ is supplied by $V_{SUPPLY}$ 350, the potentially large variation on the inverter threshold due to $V_{SUPPLY}$ 350 variations can be tolerated since the inverter $I_2$ 310 is monitoring $V_{REF}$ 300. That is, large threshold variations on the inverter $I_2$ 310 can be ignored since the primary goal here is to ensure the quality of the reference voltage $V_{REF}$ 300. On the other hand, the range of threshold variations on the inverter $I_1$ 330, which monitors $V_{SUPPLY}$, should be narrow due to its vulnerability to spikes and dips.

Furthermore, to ensure that the signal $R_{13}$ POR 316 is absolutely de-activated when neither $V_{REF}$ 300 nor $V_{SUPPLY}$ 350 is working properly, a pull-down resistor 317 can be used to couple P_POR 316 to ground.

Referring to FIG. 4(a), a first embodiment of a reduced sensitivity POR circuit in accordance with the present invention is shown. Note that the portion which generates the signal R_PORB 420 as input to the NOR gate 430 is similar to the circuit described in FIG. 3. The signal R_PORB 420 is low when both the supply voltage $V_{SUPPLY}$ and the reference voltage $V_{REF}$ are operating at an operational level. Note that the diode for providing a voltage drop from $V_{SUPPLY}$ is now implemented with a diode-connected PFET transistor 440, which can be dimensioned to provide the requisite VD voltage offsetting the voltage $V_{SUPPLY}$.

Figure 1:
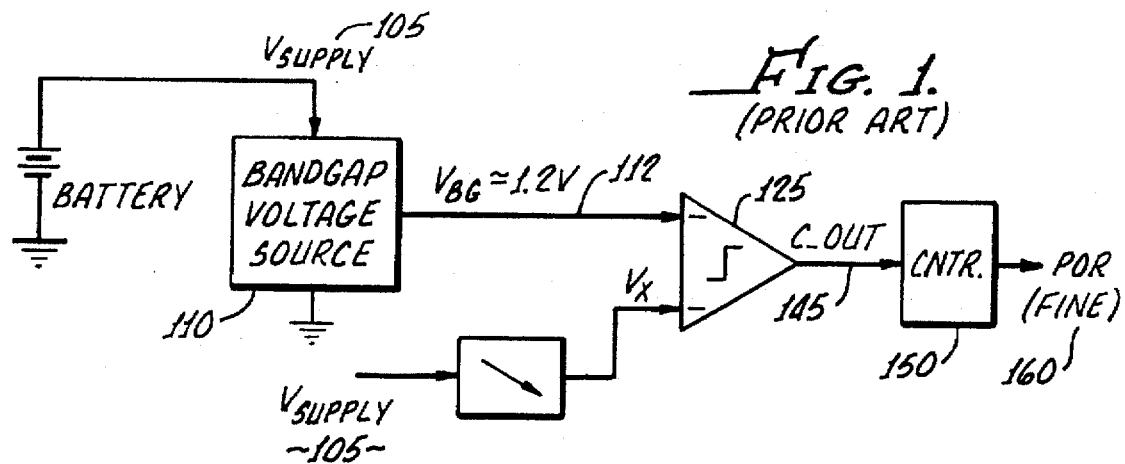
FIG. 1 is an example of a simplified POR circuit using the bandgap voltage source as benchmark.
Figure 2:
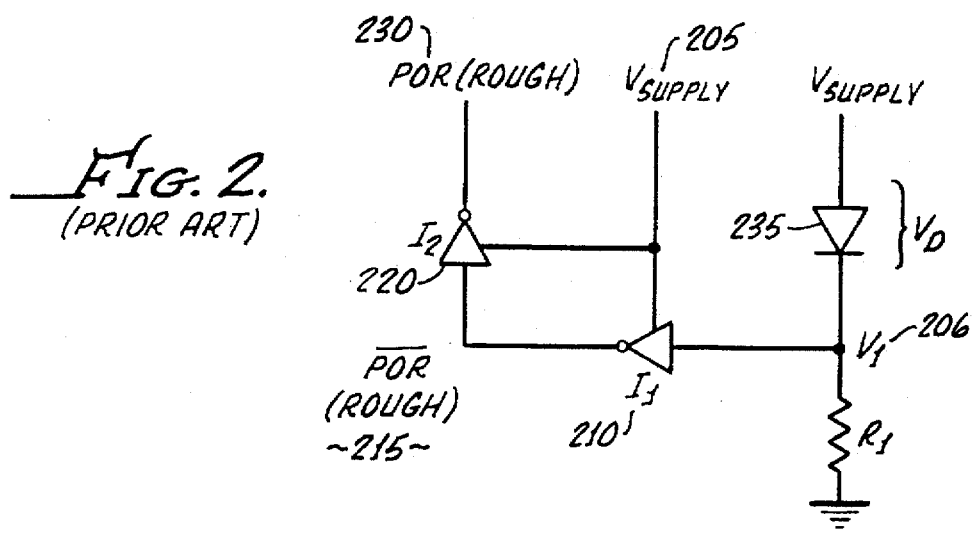
FIG. 2 is a diagram illustrating a conventional POR circuit.

Still referring to FIG. 4(a), the signal F_PORB signal 410 is derived from a "fine POR" circuit as previously described in FIG. 1. With the NOR gate 430, an activated (high) POR signal 460 will only be generated when both "fine and rough" POR circuits are operating in the normal ranges. As previously described, the "fine-POR" circuit monitors the time averaged supply voltage for crossing the lowest operational voltage in the narrowest range possible, whereas the "rough-POR" circuit monitors the more "catastrophic" voltage swings, which require the system to shut down immediately.

Although FIG. 4(a) shows an inverter 422 at the output of NOR gate 421, it should be apparent to those skilled in the art that such combination is a logic equivalent of a single OR gate. Similarly, NOR gate 430 in combination with inverters 431,434 is essentially a single NOR gate with more gain. Based on different circuitry and gain requirements, those skilled in the art can readily modify the logic gates to suit their needs.

FIG. 4(b) shows another embodiment of the reduced sensitivity POR circuit in accordance with the present invention. Note that a 3-input NOR gate 470 is now used with inputs from F_PORB 401, $V_{REF}$ 412 and $V_{SUPPLY}$ 413. Compared to the circuit in FIG. 4(a), the circuit in FIG. 4(b) effectively eliminated an NOR gate and an inverter, while achieving the same functionality.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

We claim:

1. A circuit for resetting an electronic device based on voltage variations in a power supply of the electronic device, said electronic device having a predetermined reference voltage generated by a bandgap voltage source, comprising:

voltage offset means for generating a first voltage being offset from the supply voltage by a predetermined voltage;

a first inverter having its input connected to the voltage offset means, the first inverter being powered by the predetermined reference voltage;

a second inverter having its input connected to the predetermined reference voltage, the second inverter being powered by the power supply; and either one of an OR- or a NOR- gate having its inputs from the outputs of the first and second inverters to generate a POR signal, for resetting the electronic device.

2. A circuit according to claim 1, wherein the voltage offset means is a diode with its anode connected to the supply voltage and its cathode connected to the input of the first inverter.

3. A circuit according to claim 1, wherein the voltage offset means is a diode-connected MOS transistor having its anode connected to the supply voltage and its cathode connected to the input of the first inverter.

4. A circuit for resetting an electronic device based on voltage variations of a supply voltage of the electronic device, said electronic device having a predetermined reference voltage generated by a bandgap voltage source, comprising:

a diode with its anode connected to the supply voltage and its cathode connected to a first node;

a resistor connected between the first node and ground;

a first inverter having its input connected to the first node to generate a first signal, the first inverter being powered by the predetermined reference voltage;

a second inverter having its input connected to the predetermined reference voltage source to generate a second signal, the second inverter being powered by the supply voltage;

a comparator for comparing the supply voltage, offset by a predetermined offset voltage, with the predetermined reference voltage to assert a third signal to indicate whether the supply voltage is above a predetermined level;

a counter coupled to the comparator for receiving the third POR signal and asserting a fourth signal after a predetermined time; and a NOR gate for receiving the first, second and fourth signals as inputs to generate a POR signal for the electronic device, the POR signal resetting the electronic device when at least one of the first, second and fourth signals is asserted.

5. A circuit according to claim 4, wherein the diode is a diode-connected MOS transistor.

6. A power-on reset ("POR") circuit for generating a POR signal for resetting an electronic system with a bandgap reference voltage source for generating a predetermined reference voltage, the electronic system having a supply voltage source capable of experiencing voltage variations, comprising:

a fine POR circuit for detecting whether a time-averaged supply voltage is below an accurate first predetermined level for a predetermined period and if so, asserting a first signal;

a rough POR circuit for detecting whether the supply voltage is below a second predetermined level and if so, asserting a second signal, the rough POR circuit comprising:

reference detection means for monitoring whether the reference voltage is below a predetermined level and if so, activating a third signal, the reference detection means being powered by the supply voltage;

supply detection means for monitoring whether the supply voltage is below a predetermined level and if so, asserting a fourth signal, the supply detection means being powered by the reference voltage;

an OR gate for receiving the first, third and fourth signals to assert the second signal, when at least one of the first, third and fourth signals is asserted.

7. A power-on reset ("POR") circuit for generating a POR signal for resetting an electronic system with a bandgap reference voltage source for generating a predetermined reference voltage, the electronic system having a supply voltage source capable of experiencing voltage variations, comprising:

a fine POR circuit for detecting whether a time-averaged supply voltage is below an accurate first predetermined level for a predetermined period and if so, asserting a first signal;

a rough POR circuit for detecting whether the supply voltage is below a second predetermined level and if so, asserting a second signal, the rough POR circuit comprising:

reference detection means for monitoring whether the reference voltage is below a predetermined level and if so, activating a third signal, the reference detection means being powered by the supply voltage;

supply detection means for monitoring whether the supply voltage is below a predetermined level and if so, asserting a fourth signal, the supply detection means being powered by the reference voltage;

an OR gate for receiving the third and fourth signals to assert the second signal, when either one of the third or fourth signals is asserted; and a NOR gate for receiving the first and second signals to assert the POR signal, when either one of the first or second signals is asserted, to reset the electronic system.

8. A circuit according to claim 6, wherein the fine POR circuit comprises:

a comparator for comparing the supply voltage, offset by a predetermined offset voltage, with the predetermined reference voltage to generate a fifth signal when the supply voltage is below the predetermined reference voltage;

a counter coupled to the comparator for receiving the fifth signal and generating the first signal when the fifth signal remains asserted for a predetermined time.

9. A circuit according to claim 7, wherein the fine POR circuit comprises:

a comparator for comparing the supply voltage, offset by a predetermined offset voltage, with the predetermined reference voltage to generate a fifth signal when the supply voltage is below the predetermined reference voltage;

a counter coupled to the comparator for receiving the fifth signal and generating the first signal when the fifth signal remains asserted for a predetermined time.

\* \* \* \* \*